(12) United States Patent
Boles et al.

(10) Patent No.: US 11,056,483 B2
(45) Date of Patent: *Jul. 6, 2021

(54) HETEROLITHIC MICROWAVE INTEGRATED CIRCUITS INCLUDING GALLIUM-NITRIDE DEVICES ON INTRINSIC SEMICONDUCTOR

(71) Applicant: MACOM Technology Solutions Holdings, Inc., Lowell, MA (US)

(72) Inventors: Timothy E. Boles, Tyngsboro, MA (US); Wayne Mack Struble, Franklin, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/875,406

(22) Filed: Jan. 19, 2018

(65) Prior Publication Data
US 2019/0229114 A1 Jul. 25, 2019

(51) Int. Cl.
| | |
|---|---|
| *H01L 27/06* | (2006.01) |
| *H01L 21/762* | (2006.01) |
| *H01L 27/12* | (2006.01) |
| *H01L 21/02* | (2006.01) |
| *H01L 23/66* | (2006.01) |

(52) U.S. Cl.
CPC .... *H01L 27/0605* (2013.01); *H01L 21/02389* (2013.01); *H01L 21/76264* (2013.01); *H01L 23/66* (2013.01); *H01L 27/0629* (2013.01); *H01L 27/1207* (2013.01); *H01L 21/762* (2013.01)

(58) Field of Classification Search
CPC ............ H01L 27/0605; H01L 27/1207; H01L 21/02389; H01L 21/76264; H01L 2224/94; H01L 29/868; H01L 33/0012; H01L 33/007; H01L 25/042; H01L 25/0655; H01L 25/072; H01L 25/0753; H01L 25/115
See application file for complete search history.

(56) References Cited

U.S. PATENT DOCUMENTS

| | | | |
|---|---|---|---|
| 4,692,998 A | 9/1987 | Armstrong et al. |
| 4,737,236 A | 4/1988 | Perko et al. |
| 5,268,310 A | 12/1993 | Goodrich et al. |
| 5,343,070 A | 8/1994 | Goodrich et al. |

(Continued)

OTHER PUBLICATIONS

U.S. Appl. No. 15/875,459, filed Jan. 19, 2018, Boles et al.
(Continued)

*Primary Examiner* — Hsien Ming Lee
(74) *Attorney, Agent, or Firm* — Thomas | Horstemeyer, LLP.; Jason M. Perilla

(57) ABSTRACT

Apparatus and methods relating to heterolithic microwave integrated circuits HMICs are described. An HMIC can include different semiconductor devices formed from different semiconductor systems in different regions of a same substrate. An HMIC can also include bulk regions of low-loss electrically-insulating material extending through the substrate and located between the different semiconductor regions. Passive RF circuit elements can be formed on the low-loss electrically-insulating material.

22 Claims, 11 Drawing Sheets

(56) References Cited

U.S. PATENT DOCUMENTS

| | | | |
|---|---|---|---|
| 5,696,466 A | 12/1997 | Li | |
| 5,877,530 A | 3/1999 | Aronowitz et al. | |
| 5,889,314 A | 3/1999 | Hirabayashi | |
| 5,976,941 A | 11/1999 | Boles et al. | |
| 6,014,064 A | 1/2000 | Boles et al. | |
| 6,114,716 A | 9/2000 | Boles et al. | |
| 6,150,197 A | 11/2000 | Boles et al. | |
| 6,197,645 B1 | 3/2001 | Michael et al. | |
| 6,329,702 B1 | 12/2001 | Gresham et al. | |
| 6,379,785 B1 | 4/2002 | Ressler et al. | |
| 6,465,289 B1 | 10/2002 | Streit et al. | |
| 6,600,199 B2* | 7/2003 | Voldman | H01L 21/761 257/350 |
| 7,026,223 B2 | 4/2006 | Goodrich et al. | |
| 7,071,498 B2 | 7/2006 | Johnson et al. | |
| 7,223,441 B2 | 5/2007 | Remington et al. | |
| 7,402,842 B2 | 7/2008 | Goodrich | |
| 7,419,892 B2 | 9/2008 | Sheppard et al. | |
| 7,692,263 B2 | 4/2010 | Wu et al. | |
| 7,709,859 B2 | 5/2010 | Smith et al. | |
| 7,719,091 B2 | 5/2010 | Brogle | |
| 7,745,848 B1 | 6/2010 | Rajagopal et al. | |
| 7,755,173 B2 | 7/2010 | Mondi et al. | |
| 7,858,456 B2* | 12/2010 | Chiola | H01L 27/0814 438/167 |
| 7,868,428 B2 | 1/2011 | Goodrich et al. | |
| 8,237,198 B2 | 8/2012 | Wu et al. | |
| 8,390,091 B2 | 3/2013 | Renaud | |
| 8,912,610 B2 | 12/2014 | Lin et al. | |
| 8,946,724 B1 | 2/2015 | Shinohara et al. | |
| 9,142,659 B2 | 9/2015 | Dora et al. | |
| 9,281,417 B1 | 3/2016 | Lin | |
| 9,431,551 B2 | 8/2016 | Wilhelm | |
| 9,559,012 B1 | 1/2017 | Chu et al. | |
| 9,799,760 B2 | 10/2017 | Green et al. | |
| 9,818,856 B2 | 11/2017 | Hoshi et al. | |
| 9,837,521 B2 | 12/2017 | Yamamoto et al. | |
| 9,837,524 B2 | 12/2017 | Miyake et al. | |
| 9,853,108 B2 | 12/2017 | Kawaguchi | |
| 9,893,174 B2 | 2/2018 | Chowdhury et al. | |
| 9,911,817 B2 | 3/2018 | Ling et al. | |
| 9,935,190 B2 | 4/2018 | Wu et al. | |
| 2002/0139971 A1 | 10/2002 | Eda | |
| 2003/0141518 A1* | 7/2003 | Yokogawa | H01L 21/8252 257/194 |
| 2005/0145851 A1 | 7/2005 | Johnson et al. | |
| 2007/0018199 A1 | 1/2007 | Sheppard et al. | |
| 2007/0126067 A1 | 6/2007 | Hattendorf et al. | |
| 2008/0265379 A1 | 10/2008 | Brandes et al. | |
| 2008/0308813 A1 | 12/2008 | Suh et al. | |
| 2009/0026498 A1 | 1/2009 | Matsuda | |
| 2009/0267078 A1 | 10/2009 | Mishra et al. | |
| 2010/0019279 A1 | 1/2010 | Chen et al. | |
| 2010/0117146 A1 | 5/2010 | Ikeda et al. | |
| 2010/0164062 A1 | 7/2010 | Wang et al. | |
| 2011/0049526 A1 | 3/2011 | Chu et al. | |
| 2012/0223320 A1 | 9/2012 | Dora et al. | |
| 2013/0043517 A1 | 2/2013 | Yin et al. | |
| 2014/0103357 A1 | 4/2014 | Decoutere et al. | |
| 2014/0159116 A1 | 6/2014 | Briere et al. | |
| 2014/0231823 A1 | 8/2014 | Chowdhury et al. | |
| 2014/0306235 A1 | 10/2014 | Decoutere et al. | |
| 2015/0034958 A1 | 2/2015 | Wong et al. | |
| 2015/0060876 A1 | 3/2015 | Xing et al. | |
| 2015/0294984 A1 | 10/2015 | Cheng et al. | |
| 2015/0295074 A1 | 10/2015 | Ozaki et al. | |
| 2015/0303291 A1 | 10/2015 | Makiyama et al. | |
| 2016/0086938 A1 | 3/2016 | Kinzer | |
| 2016/0155674 A1* | 6/2016 | Cho | H01L 25/16 438/123 |
| 2016/0190298 A1 | 6/2016 | Wu et al. | |
| 2016/0233235 A1 | 8/2016 | Miyairi et al. | |
| 2016/0351092 A1* | 12/2016 | Chen | G09G 3/3233 |
| 2017/0133500 A1 | 5/2017 | Eton et al. | |
| 2017/0301780 A1 | 10/2017 | Boles et al. | |
| 2017/0301781 A1 | 10/2017 | Boles et al. | |
| 2017/0301798 A1 | 10/2017 | Kaleta et al. | |
| 2017/0301799 A1 | 10/2017 | Boles et al. | |
| 2017/0317202 A1 | 11/2017 | Green et al. | |
| 2017/0338171 A1* | 11/2017 | Cho | H01L 23/49537 |
| 2017/0345812 A1 | 11/2017 | Chou et al. | |
| 2018/0175268 A1* | 6/2018 | Moon | H01L 33/62 |
| 2018/0248009 A1 | 8/2018 | Wong et al. | |
| 2018/0295683 A1 | 10/2018 | Tung et al. | |
| 2019/0229114 A1 | 7/2019 | Boles et al. | |
| 2019/0229115 A1 | 7/2019 | Boles et al. | |
| 2019/0341480 A1 | 11/2019 | Boles et al. | |

OTHER PUBLICATIONS

U.S. Appl. No. 15/223,455, filed Jul. 29, 2016, Kaleta et al.
U.S. Appl. No. 15/223,677, filed Jul. 29, 2016, Boles et al.
U.S. Appl. No. 15/875,441, filed Jan. 19, 2018, Boles et al.
U.S. Appl. No. 16/431,480, filed Jun. 4, 2019, Boles et al.
PCT/US2017/027779, dated Oct. 5, 2017, Invitation to Pay Additional Fees.
PCT/US2017/027779, dated Nov. 29, 2017, International Search Report and Written Opinion.
PCT/US2017/027779, dated May 8, 2018, Written Opinion of the IPEA.
PCT/US2017/027779, dated Aug. 9, 2018, Ch. II International Preliminary Report on Patentability.
PCT/US2017/027780, dated Sep. 25, 2017, Invitation to Pay Additional Fees.
PCT/US2017/027780, dated Dec. 21, 2017, International Search Report and Written Opinion.
PCT/US2017/027780, dated May 30, 2018, Written Opinion of the IPEA.
PCT/US2017/027780, dated Jul. 24, 2018, Ch. II International Preliminary Report on Patentability.
U.S. Appl. No. 15/223,455, Kaleta et al., dated Jul. 29, 2016.
U.S. Appl. No. 15/223,677, Boles et al., dated Jul. 29, 2016.
U.S. Appl. No. 15/875,441, Boles et al., dated Jan. 19, 2018.
U.S. Appl. No. 16/431,480, Boles et al., dated Jun. 4, 2019.
Invitation to Pay Additional Fees for Application No. PCT/US2017/027779 dated Oct. 5, 2017.
International Search Report and Written Opinion for Application No. PCT/US2017/027779 dated Nov. 29, 2017.
Written Opinion of the IPEA for Application No. PCT/US2017/027779 dated May 8, 2018.
Ch. II International Preliminary Report on Patentability for International Application No. PCT/US2017/027779, dated Aug. 9, 2018.
Invitation to Pay Additional Fees for Application No. PCT/US2017/027780 dated Sep. 25, 2017.
International Search Report and Written Opinion dated Dec. 21, 2017 for Application No. PCT/US2017/027780.
Written Opinion of the IPEA for Application No. PCT/US2017/027780 dated May 30, 2018.
Ch. II International Preliminary Report on Patentability for International Application No. PCT/US2017/027780, dated Jul. 24, 2018.
Tangsheng et al., AlGaN/GaN MIS HEMT with AlN Dielectric. GaAs Mantech Conf Proc. 2006: 227-30.
Tsou et al., 2.07-kV AlGaN/GaN Schottky Barrier Diodes on Silicon With High Baliga's Figure-of-Merit. IEEE Electron Device Letters. Jan. 2016;37(1):70-3.

* cited by examiner

HETEROLITHIC MICROWAVE INTEGRATED CIRCUITS INCLUDING GALLIUM-NITRIDE DEVICES ON INTRINSIC SEMICONDUCTOR

BACKGROUND

Technical Field

The technology relates to high-speed, heterolithic microwave integrated circuits that include integrated devices formed from silicon, integrated devices formed from gallium nitride, integrated circuit elements, and regions of bulk electrically-insulating material.

Discussion of the Related Art

High-speed and power amplifier circuits have a variety of useful applications, such as radio-frequency (RF) communications, radar, RF power, and microwave applications. Such circuits may include diodes and power transistors formed from semiconductor materials and a number of other circuit components, such as capacitors, inductors, resistors, microstrip lines, and interconnects. Gallium nitride semiconductor material has received appreciable attention in recent years because of its desirable electronic and electro-optical properties. GaN has a wide, direct bandgap of about 3.4 eV that corresponds to the blue wavelength region of the visible spectrum. Because of its wide bandgap, GaN is more resistant to avalanche breakdown and can maintain electrical performance at higher temperatures than other semiconductors, such as silicon. GaN also has a higher carrier saturation velocity compared to silicon. Additionally, GaN has a Wurtzite crystal structure, is a very stable and hard material, has a high thermal conductivity, and has a much higher melting point than other conventional semiconductors such as silicon, germanium, and gallium arsenide. Accordingly, GaN can be used to make transistors and diodes for high-speed, high-voltage, and high-power applications.

SUMMARY

Structures and methods associated with high-speed, heterolithic microwave integrated circuits (HMICs) are described. AN HMIC of the present embodiments can comprise a substrate having regions of different semiconductor materials and regions of electrically-insulating dielectric material that extend through the substrate. The regions of different semiconductor materials can include different integrated devices formed from the different semiconductor materials having different base elemental compositions (e.g., silicon and III-nitride). Conductive interconnects and passive devices (e.g., capacitors and inductors) can be formed over regions of the electrically-insulating material that exhibits lower loss to radio-frequency waves than semiconductor material. Inclusion of the electrically-insulating dielectric material in an HMIC can improve electrical performance (e.g., higher Q values for resonators) of the microwave integrated circuits.

Some embodiments relate to an integrated circuit comprising a first region of a substrate containing a first integrated device formed from a first semiconductor material; a second region of the substrate containing a second integrated device formed from a second semiconductor material of a different base elemental composition than the first semiconductor material; and a third region of the substrate containing an electrically-insulating dielectric material that extends through the substrate, wherein the third region of the substrate is located between the first region and the second region.

Some embodiments relate to a method of making a heterolithic microwave integrated circuit, the method comprising forming a first semiconductor device from a first semiconductor material in a first region of a wafer; forming a second semiconductor material on the first semiconductor material in a second region of the wafer, the second semiconductor material having a different base elemental composition than the first semiconductor material; forming a second semiconductor device from the second semiconductor material; etching a cavity in a third region of the wafer; filling the cavity with an electrically-insulating material; planarizing the electrically-insulating material; and removing a portion of a backside of the wafer to form a substrate, wherein the electrically-insulating material extends through the substrate.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

FIG. 4-1 illustrates example structure associated with a method for making an HMIC;

FIG. 4-2A illustrates example structure that includes a patterned resist as part of a process for making a first device in a first region of an HMIC;

FIG. 4-2B and FIG. 4-2C illustrates example structure associated with semiconductor doping in a first region for a first device of an HMIC;

FIG. 4-3 illustrates structure associated with forming a second device in a second region of an HMIC;

FIG. 4-4A illustrates formation of an epitaxial layer of one or more layers of a different semiconductor material on an intrinsic semiconductor layer in a second region of an HMIC;

FIG. 4-4B illustrates formation of one or more epitaxial layers of a different semiconductor material directly on a highly doped semiconductor layer in a second region of an HMIC;

FIG. 4-4C illustrates formation of one or more epitaxial layers of a different semiconductor material on a highly doped region of an intrinsic semiconductor layer in a second region of an HMIC;

FIG. 4-5 illustrates removal of the different semiconductor material except for a portion in the second region of the HMIC;

FIG. 4-6A illustrates protective layers formed over the different semiconductor material in the second region of the HMIC;

FIG. 4-6B illustrates patterned protective layers that expose underlying semiconductor material;

FIG. 4-6C illustrates etched cavities in the underlying semiconductor materials;

FIG. 4-7A illustrates an electrically conductive film formed in the etched cavities;

FIG. 4-7B illustrates a protective layer formed over the HMIC structure and application of an electrically-insulating dielectric material (glass, for example) that will fill the etched cavities;

FIG. 4-7C illustrates flow of the electrically-insulating dielectric material into the etched cavities and residual air bubbles at the bottom of the etched cavities;

FIG. 4-7D illustrates planarization of the electrically-insulating material;

FIG. 4-8A illustrates etched openings in the electrically-insulating material;

FIG. 4-8B illustrates a deepening of the etched openings;

FIG. 5 illustrates circuitry formed for an HMIC;

FIG. 6 illustrates passivation of HMIC circuitry;

FIG. 7 illustrates an example portion of an HMIC substrate in which a portion of the wafer's backside has been removed and a conductive ground plane has been deposited;

FIG. 8A depicts a plan view of an example package that can contain an HMIC die; and FIG. 8B depicts an elevation view of an example package that can contain an HMIC die.

Features and advantages of the illustrated embodiments will become more apparent from the detailed description set forth below when taken in conjunction with the drawings.

DETAILED DESCRIPTION

Applications supporting mobile communications and wireless internet access under current and proposed communication standards, such as WiMax, 4G, and 5G, can place austere performance demands on high-speed amplifiers and circuits comprising semiconductor transistors, semiconductor diode switches, and other radio-frequency circuit elements. For example, amplifiers may need to meet performance specifications related to output power, signal linearity, signal gain, bandwidth, and efficiency. Meeting these demands can also place tight performance constraints on components connected to the transistors, such as components used for input and/or output impedance-matching networks and signal switching. Transistors comprising gallium nitride material are useful for high-speed, high-voltage, and high-power applications (such as wireless communications and power conversion, for example), because of the favorable material properties of gallium nitride described above. In some cases, amplifiers formed from gallium nitride material that exhibit high gain and high drain efficiency (greater than 60%) at high power levels (e.g., power levels over 10 Watts) are desired.

Radio-frequency (RF) circuitry often includes other elements in addition to transistors, such as capacitors, inductors, diodes, interconnects, antennas, signal couplers, power splitters, and microstrip transmission lines. It can be desirable to integrate some or all of these components onto a monolithic microwave integrated circuit for some RF applications. The inventors have recognized and appreciated that diode switches formed from silicon semiconductor materials can have more desirable properties in terms of insertion loss, isolation, distortion, linearity and power handling than switches formed from gallium nitride materials. Accordingly, in some circuits it would be desirable to integrate onto a same substrate diodes having active areas formed from silicon semiconductor materials and transistors formed from gallium nitride materials. Embodiments herein describe structures and processes for integrating at least two different semiconductor devices formed from different semiconductor material systems having different base elemental compositions onto a single heterolithic microwave integrated circuit (HMIC).

Figure 1:
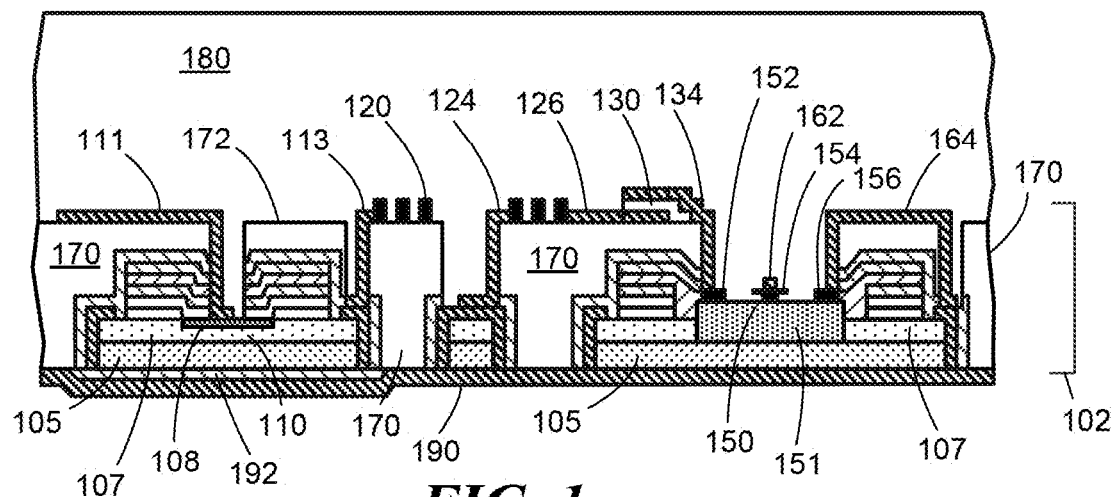
FIG. 1 depicts an example portion of a heterolithic microwave integrated circuit (HMIC) according to a first embodiment.

FIG. 1 illustrates a portion of an HMIC that includes two different semiconductor devices formed from different semiconductor material systems having different base elemental compositions, according to a first aspect of the disclosed technology. An HMIC can include a first semiconductor device 110 formed from a first semiconductor material system and a second semiconductor device 150 formed from a second semiconductor material system. The first semiconductor device 110 can comprise a silicon material system, though the invention is not limited to only silicon material systems. In some cases, the first semiconductor device 110 can comprise a silicon-carbide or silicon-germanium material system. As just one example, the active layers of the first semiconductor device 110 can comprise doped silicon layers. In embodiments, the first semiconductor device 110 can be a diode (e.g., a p-i-n diode or n-i-p diode), though the invention is not limited to only these diodes. Other types of diodes (e.g., p-n, n-p, Schottky diodes, etc.) or semiconductor devices (e.g., transistors) can be formed from a first semiconductor material on the HMIC in other embodiments. In the illustrated example, a p-i-n diode can be formed from a highly doped region 108 (p-type conductivity) formed in an intrinsic layer 107 disposed on an n-doped substrate 105.

In embodiments, the second semiconductor device 150 can be a transistor of any type formed from a gallium-nitride material system. The illustrated example depicts a high-electron-mobility transistor (HEMT) that is formed from one or more epitaxial layers 151 of gallium nitride material, though other types of transistors (e.g., field-effect transistors, junction field-effect transistors, bipolar junction transistors, insulated-gate bipolar transistors, etc.) can be formed in an HMIC in some embodiments. According to one aspect, the one or more epitaxial layers 151 of gallium nitride material can be grown directly on a highly doped substrate 105, as depicted in FIG. 1, and used to form a HEMT semiconductor device 150. The HEMT can have a drain contact 152, a gate contact 154 and a source contact 156. The one or more epitaxial layers 151 of gallium nitride material can be formed using processes described in U.S. Pat. No. 9,627,473, issued Apr. 18, 2017, and titled "Parasitic Channel Mitigation in III-nitride Material Semiconductor Structures," which is incorporated herein by reference. Additional examples of epitaxial layers 151 can be found in, U.S. Pat. No. 7,135,720, issued Nov. 14, 2006, titled "Gallium Nitride Material Transistors and Methods Associated with the Same," and in U.S. Pat. No. 9,064,775, issued Jun. 23, 2015, titled "Gallium Nitride Semiconductor Structures with Compositionally-Graded Transition Layer," which are both incorporated herein by reference in their entirety. In embodiments, a HEMT can be formed on an HMIC using processes described in U.S. patent application Ser. No. 15/223,734, filed Jul. 29, 2016, and titled "High-Voltage GaN High Electron Mobility Transistors with Reduced Leakage Current," which is incorporated herein by reference.

The inventors have recognized and appreciated that forming a gallium-nitride device on highly doped silicon (e.g., a doping density of at least $5\times10^{18}$ cm$^{-3}$) can mitigate deleterious effects associated with parasitic currents in an underlying lightly doped and more resistive semiconductor material. In embodiments, the resistivity of the semiconductor (e.g., silicon) on which the one or more epitaxial layers 151 of gallium nitride material are formed can be between 0.0001 ohm-cm and 0.010 ohm-cm. In some cases, the resistivity of the semiconductor on which the one or more epitaxial layers 151 of gallium nitride material are formed is between 0.0001 ohm-cm and 0.005 ohm-cm.

For the embodiment depicted in FIG. 1, the one or more epitaxial layers 151 of gallium nitride material are formed directly on a highly doped substrate 105. To do this, a portion of an intrinsic semiconductor layer 107 has been removed by etching, for example. In an alternative embodiment depicted in FIG. 2, one or more epitaxial layers 151 of gallium nitride material can be formed on a highly doped region 158 of an intrinsic semiconductor layer 107. The highly doped region can be formed by ion implantation and diffusion, for example, though other doping techniques may be used. In some cases, a thin, highly doped layer comprising the same semiconductor material (e.g., silicon) as the intrinsic layer 107 can be epitaxially grown on the intrinsic layer 107 to form a highly doped region 158 on which the one or more epitaxial layers 151 can be deposited. In embodiments, the highly doped region 158 can have a doping density of at least $5\times10^{18}$ cm$^{-3}$. The resistivity of the highly doped region 158 can be between 0.0001 ohm-cm and 0.010 ohm-cm, in some cases, or between 0.0001 ohm-cm and 0.005 ohm-cm in other embodiments.

Figure 3:
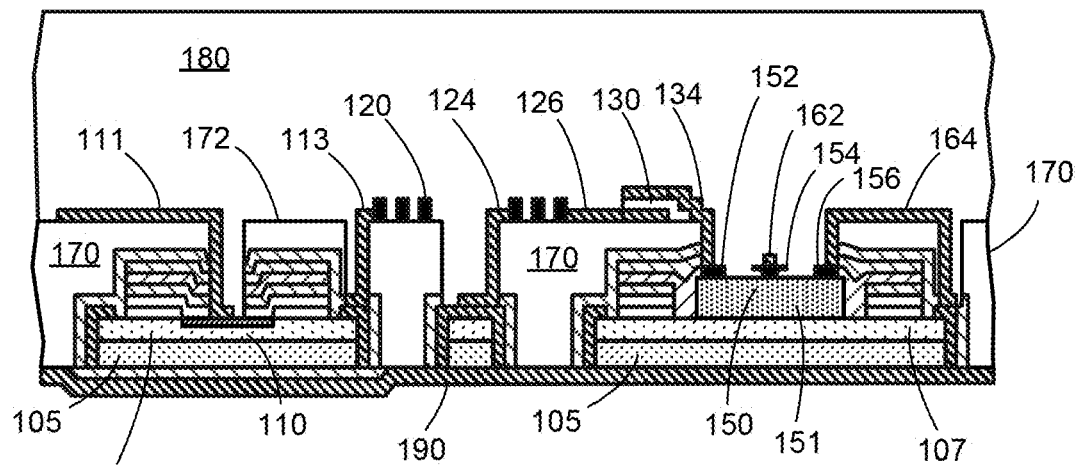
FIG. 3 depicts an example portion of an HMIC according to a third embodiment.

Another approach to forming one or more epitaxial layers 151 of gallium nitride material for an HMIC is illustrated in FIG. 3. In some cases, the one or more epitaxial layers 151 of gallium nitride material can be formed directly on intrinsic semiconductor material 107, such as intrinsic silicon. The inventors have recognized and appreciated that highly resistive semiconductor material underlying a device formed from the gallium nitride material can also mitigate deleterious effects associated with parasitic conductance in the underlying semiconductor material. For example, intrinsic silicon can behave like insulating material so that little or no parasitic currents flow in the underlying semiconductor material. In such embodiments, the resistivity of the underlying semiconductor material can be between 100 ohm-cm and 10,000 ohm-cm. In some cases, the resistivity of the underlying semiconductor material can be between 2000 ohm-cm and 10,000 ohm-cm.

Figure 2:
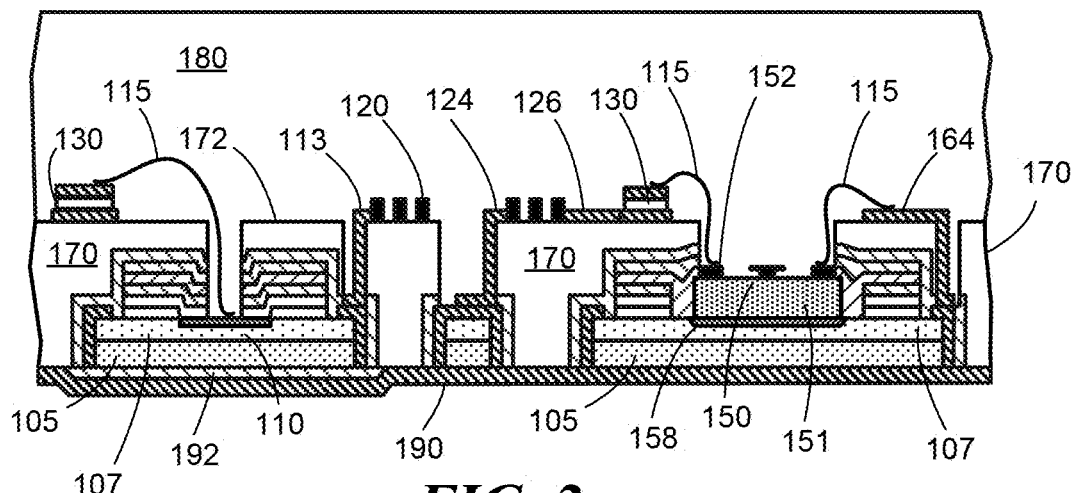
FIG. 2 depicts an example portion of an HMIC according to a second embodiment.

In FIG. 1-FIG. 3, the intrinsic semiconductor layer 107 can have a thickness of any value in a range from 10 microns to 50 microns. In some cases, the thickness of the intrinsic semiconductor layer 107 can be less than 10 microns. In other cases, the thickness of the intrinsic semiconductor layer 107 can be more than 50 microns. A total thickness of the one or more epitaxial layers 151 of gallium nitride material can be any value in a range from 1.5 microns to 6 microns. In some cases, a GaN buffer layer having a thickness between 1.5 microns and 4 microns can be formed within the one or more epitaxial layers 151 to obtain semiconductor devices with very high reverse-bias breakdown voltages. Schottky diodes and HEMTs formed with such thick buffer layers and other features described in U.S. patent application Ser. No. 15/223,734, referenced above, can sustain reverse bias voltages as much as 2000 volts, exhibit low leakage currents (e.g., not more than 40 microamps per millimeter of transistor gate width), and handle large forward currents (as much as 1 amp per millimeter of gate width).

An HMIC according to the present embodiments can include additional RF circuitry formed on a same wafer and die. Referring again to FIG. 1, an HMIC can include an electrically-insulating material 170 that extends through the monolithic substrate 102 and upon which some RF circuit elements can be formed. The insulating material 170 can comprise a glass or other dielectric material that is electrically insulating and exhibits low loss for RF fields that penetrate into the insulating material 170. For example, a loss tangent of the insulating material 170 can be as low as 0.002 at 10 GHz. In some cases, the loss tangent of the insulating material 170 can be between 0.0001 and 0.0004 in a frequency range between 500 MHz and 10 GHz. A benefit of an HMIC is that RF circuit elements can be formed over regions of the insulating material 170 and thereby exhibit lower loss than they would if formed over semiconductor material. Other benefits of the insulating material 170 include improved electrical isolation between semiconductor devices, lower permittivity compared to semiconductor material, and structural support for RF circuitry. A transparent insulating material 170 can also provide optical visibility through the wafer on which HMICs are fabricated. Through-wafer optical visibility can facilitate backside alignment for patterning structures on a backside of the HMIC, such as patterned islands of electrically-insulating film 192 for device isolation. For example, an insulating film 192 can be formed and patterned on a backside of the HMIC in a correct location to allow for electrical isolation and/or biasing of a device (e.g., biasing a cathode of a p-i-n diode).

RF circuitry formed on an HMIC can include a variety of circuit elements. FIG. 1 illustrates RF circuitry that includes a p-i-n diode as a first semiconductor device 110 and a HEMT as a second semiconductor device 150. In the example embodiments, the first semiconductor device 110 is formed from a first semiconductor material system (e.g., silicon) that is different from a second semiconductor material system (e.g., gallium-nitride) that is used to form the second semiconductor device 150. The illustrated RF circuitry also includes passive elements such as capacitors 130 (e.g., metal-insulator-metal capacitors and/or metal-insulator-semiconductor capacitors) and inductors 120 (e.g., patterned spiral inductors or meandering interconnects), though other integrated circuit elements can be formed on an HMIC. Passive elements can be located over regions of the insulating material 170 to reduce electrical losses associated with fields penetrating into the underlying material, as described above. RF circuitry of an HMIC can further include patterned conductive interconnects 111, 113, 124, 126, 134, 162, 164, as depicted in FIG. 1, and/or wire bonds 115, depicted in FIG. 2. To protect the RF circuitry, an HMIC can be covered with a passivation layer 180.

In various embodiments, at least a portion of a backside of an HMIC can be covered with a conductive film 190. In some cases, the conductive film 190 can provide an electrical ground plane or reference potential plane for the RF circuitry. The conductive film 190 can comprise one or more metal layers, and may also be used for mounting the HMIC on a receiving substrate. For example, the HMIC can be adhered to a receiving substrate using a solder bond, which can provide a low-loss electrical connection to the conductive film 190. In some cases, the HMIC can be adhered to a receiving substrate using a thermally-conductive adhesive or electrically and thermally-conductive bond. A benefit of regions or islands of conductive semiconductor material on which semiconductor devices are formed within an HMIC is that these regions or islands of conductive semiconductor material can provide improved thermal conductivity of heat from the semiconductor devices to a backside of the HMIC where heat can be further dissipated into air or into a receiving substrate to which the HMIC is bonded.

Figures 1, 4:
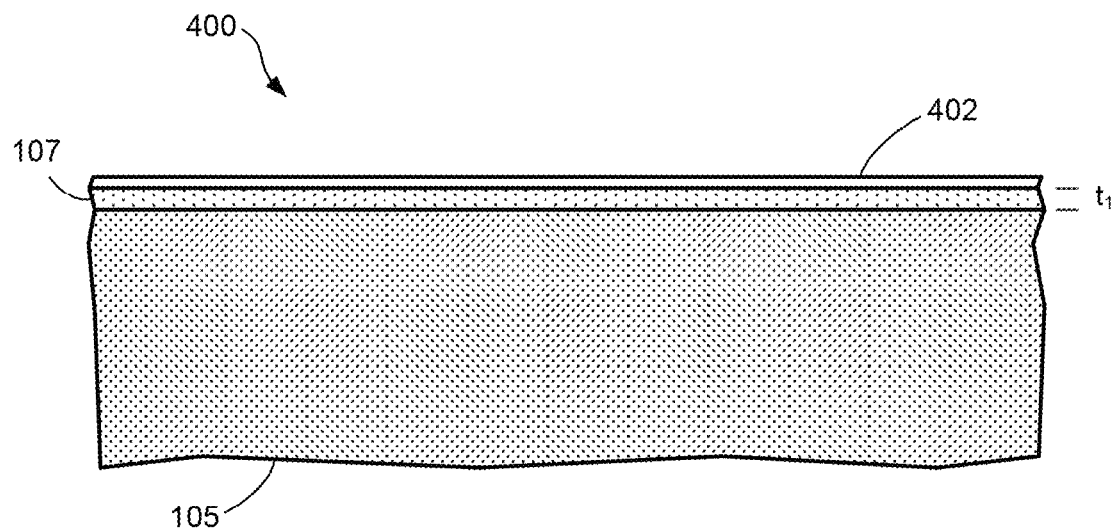

Example fabrication processes will now be described for heterolithic microwave integrated circuits. For HMICs that may include a p-i-n or n-i-p diode, an example fabrication process can begin with a semiconductor wafer 400, of which a portion is depicted in FIG. 4-1. The wafer 400 can comprise a doped substrate 105 (e.g., doped for n-type or p-type conductivity), an undoped or intrinsic layer 107, and a hard mask 402.

In some cases, an entire wafer can be doped when grown. In other cases, an upper region of the substrate 105 can be doped (e.g., by ion implantation or epitaxial growth) to obtain a doping density desired for a semiconductor device. In embodiments, a doping density of the substrate 105 near the process surface of the wafer 400 can be between $10^{15}$ cm$^{-3}$ and $10^{21}$ cm$^{-3}$. As one example, the substrate 105 near the process surface can have n$^+$ or p$^+$ doping. If present, an intrinsic layer 107 can be formed by epitaxial growth over the doped substrate 105. The intrinsic layer can be formed from a same semiconductor material as the substrate 105, though in some cases a different material may be used for the intrinsic layer. In embodiments, the intrinsic layer 107 can have a thickness $t_1$ of any value in a range from 10 microns to 50 microns, though other thicknesses may be used in some cases.

For lithographic purposes, the intrinsic layer 107 can be covered with a hard mask 402, which can be electrically insulating. An example hard mask 402 is thermal oxide, which can be grown on the intrinsic layer 107. In alternative embodiments, an oxide or nitride layer can be deposited by electron-beam evaporation, plasma deposition, atomic layer deposition, or chemical vapor deposition. A thickness of the hard mask can be between 200 nanometers (nm) and 2 microns.

Figures 2A, 4:
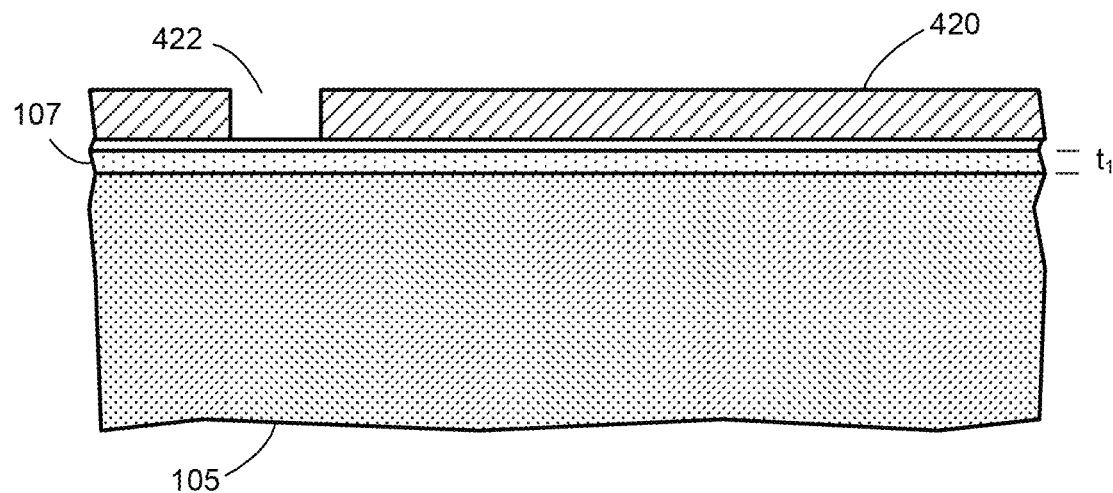
Figures 2B, 4:
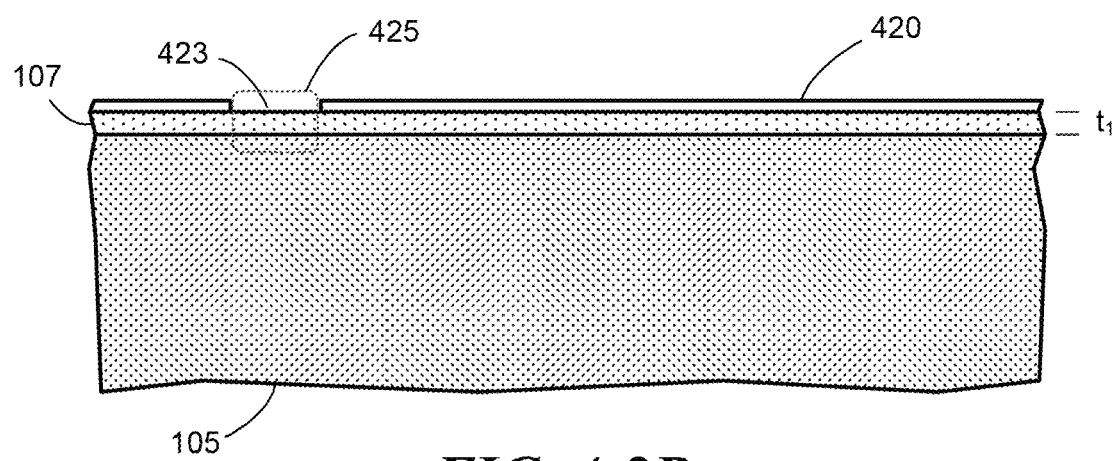
Figures 2C, 4:
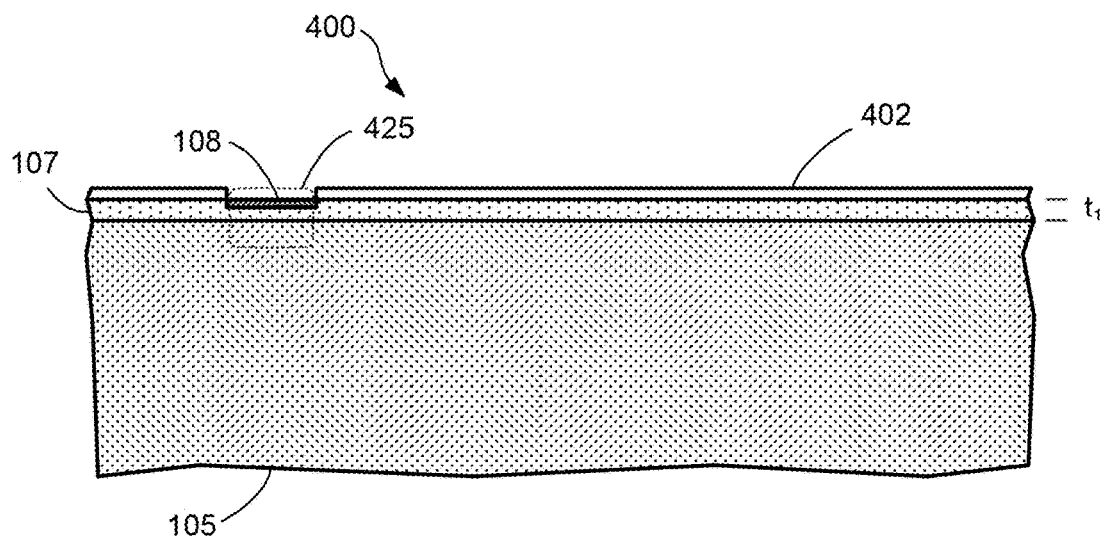
Figures 3, 4:
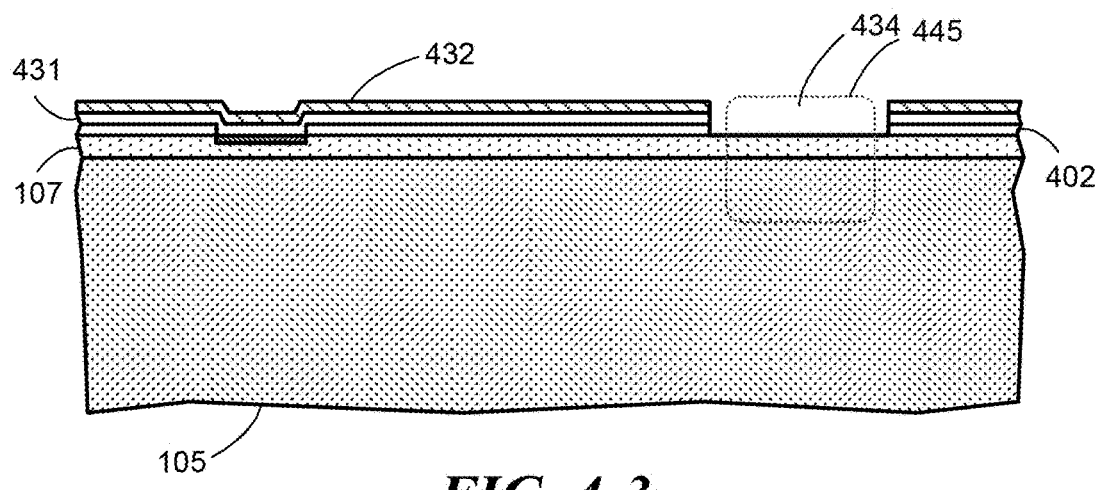

FIG. 4-2A through FIG. 4-2C illustrate steps by which semiconductor layers for a first semiconductor device can be formed in a first region of the substrate 105. A resist 420 can be patterned over the hard mask 402 as depicted in FIG. 4-2A. The resist can comprise a photoresist (e.g., a polymeric photoresist), though other types of resists can be used alternatively or additionally. For example, a multilayer resist can be used, where one layer of the multilayer resist is used to pattern other layers of the multilayer resist, which in turn are used to pattern one or more underlying materials. A multilayer resist can comprise organic and inorganic layers. One example of a multilayer resist is a photoresist formed on an oxide or nitride layer.

In embodiments, the resist 420 may be lithographically patterned to from one or more openings 422 in the resist 420 across the wafer 400. For example, the one or more openings 422 can be formed by photolithographic exposure and subsequent immersion of the wafer in a developer. The one or more openings 422 can then be transferred to the underlying hard mask 402 by etching, for example, as depicted in FIG. 4-2B. In some cases, reactive ion etching can be used to obtain anisotropic etching of the underlying hard mask 402 when forming openings 423. In other cases, immersion in a chemical etchant can be used to form one or more openings 423 in the hard mask 402. After forming the one or more openings 423 in the hard mask 402, the resist 420 can be stripped from the wafer 400 leaving the structure shown in FIG. 4-2B.

The one or more openings 423 expose one or more first regions 425 of the underlying semiconductor material in which one or more first semiconductor devices can be formed, as depicted in FIG. 4-2C. In embodiments, the first semiconductor devices can be formed from a first semiconductor material system that has a base elemental composition that is common with the substrate 105. For example, the substrate 105 near the process surface can be doped silicon, and the first semiconductor devices can be silicon-based semiconductor devices. As another example, the substrate 105 near the process surface can be doped silicon-germanium, and the first semiconductor devices can be silicon-germanium semiconductor devices. Another semiconductor system for the first semiconductor devices could be silicon-carbide.

It will be appreciated that a plurality of semiconductor devices can be formed in parallel across the wafer 400, of which only a portion is shown in FIG. 4-2C. To simplify further description of processes used to form an HMIC, reference will only be made to the singular devices depicted in the illustrations.

In embodiments, semiconductor layers for a first semiconductor device can be formed in the first region 425 by doping a portion of the intrinsic layer 107. The doping can be performed by ion implantation and heating to diffuse and activate the dopants. The doped region 108 can have an opposite conductivity type from the substrate 105. For example, the doped region 108 can comprise heavily doped p-type semiconductor material and the substrate can comprise highly doped n-type semiconductor material to form p-i-n diode layers. In another embodiment, the doped region 108 can comprise heavily doped n-type semiconductor material and the substrate can comprise highly doped p-type semiconductor material to form n-i-p diode layers.

After forming semiconductor layers for the first semiconductor device in the first region 425, at least the first region (and possibly the majority of the wafer 400) can be covered by protective layers in preparation for forming a second semiconductor device in a second region 445. For example, an oxide layer 431 can be formed over at least the first region 425, as depicted in FIG. 4-3. In some cases, the oxide layer 431 comprises a thermal oxide, though other oxides described above may be used. A thickness of the oxide layer 431 can be between 50 nm and 300 nm. Additionally, a nitride protective layer 432 can be formed over the oxide layer 431. The nitride layer can be formed using low pressure chemical vapor deposition (LPCVD), according to some embodiments. A thickness of the nitride layer 432 can be between 50 nm and 300 nm. In some embodiments, the nitride layer 432 can be used to compensate for in-plane stress introduced by the oxide layer 431 to help prevent bowing of the wafer 400. A resist and etching process, as described in connection with FIG. 4-2A and FIG. 4-2B, can be used to pattern a second opening 434 in the oxide and nitride layers for forming a second semiconductor device.

Figures 4, 4A:
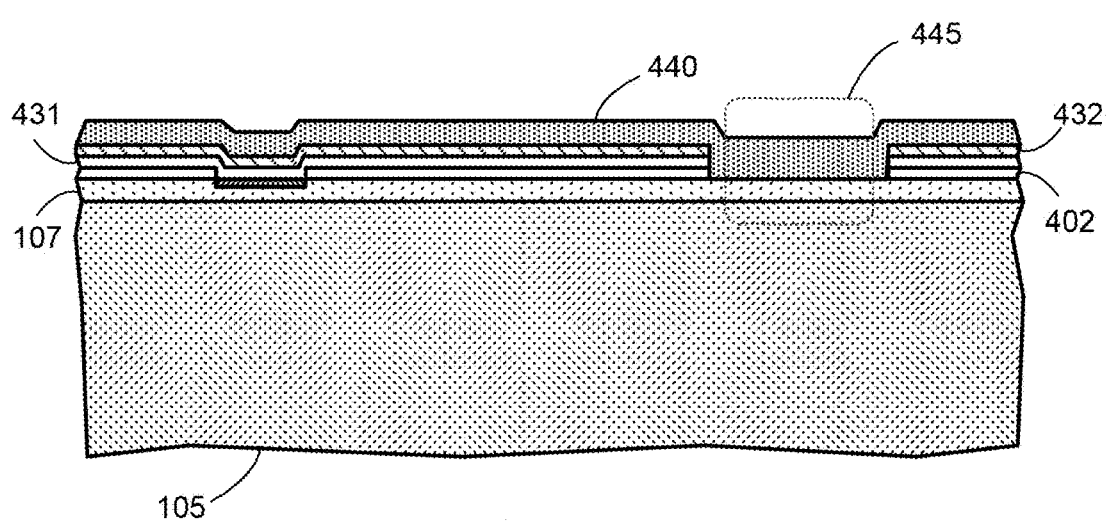

Epitaxial growth can then be used to form one or more layers comprising a second semiconductor material 440 in a second device region 445, as depicted in FIG. 4-4A. The second semiconductor material 440 can comprise gallium-nitride material, for example. Among the one or more layers may be buffer layers formed from other III-nitride material (e.g., aluminum nitride). The one or more layers comprising the second semiconductor material 440 can include layered structures described in the U.S. applications and patents referenced above, for example. Because epitaxial growth of gallium-nitride material can require high temperatures (e.g., GaN epitaxy can require temperatures up to 1000° C. or higher), it can be advantageous to form the second semiconductor material 440 for the HMIC prior to forming the insulating material 170, which can reflow at significantly lower temperatures.

As used herein, the phrase "gallium-nitride material" refers to gallium nitride (GaN) and any of its alloys, such as aluminum gallium nitride (AlxGa (1-x)N), indium gallium nitride (InyGa(1-y)N), aluminum indium gallium nitride (AlxInyGa(1-x-y)N), gallium arsenide phosporide nitride (GaAsxPy N(1-x-y)), aluminum indium gallium arsenide phosporide nitride (AlxInyGa(1-x-y)AsaPb N(1-a-b)), amongst others. Typically, when present, arsenic and/or phosphorous are at low concentrations (i.e., less than 5 percent by weight). In certain preferred embodiments, the gallium-nitride material has a high concentration of gallium and includes little or no amounts of aluminum and/or indium. In high gallium concentration embodiments, the sum of (x+y) may be less than 0.4 in some implementations, less than 0.2 in some implementations, less than 0.1 in some implementations, or even less in other implementations. In some cases, it is preferable for at least one gallium-nitride material layer to have a composition of GaN (i.e., x=y=a=b=0). For example, an active layer in which a majority of current conduction occurs may have a composition of GaN. Gallium-nitride materials in a multi-layer stack may be doped n-type or p-type, or may be undoped. Suitable gallium-nitride materials are described in U.S. Pat. No. 6,649,287, which is incorporated herein by reference in its entirety.

FIG. 4-4A depicts one embodiment in which one or more layers comprising a second semiconductor material 440 are formed in a second device region 445. In this embodiment, the one or more layers comprising a second semiconductor material 440 are formed directly on an intrinsic semiconductor layer 107, corresponding to structure depicted in FIG. 3. As described in connection with FIG. 1, it can be beneficial to form a second semiconductor device on a highly resistive semiconductor to reduce losses associated with parasitic conductance compared to losses associated with an underlying less resistive and more lossy semiconductor material.

Figures 4, 4B:
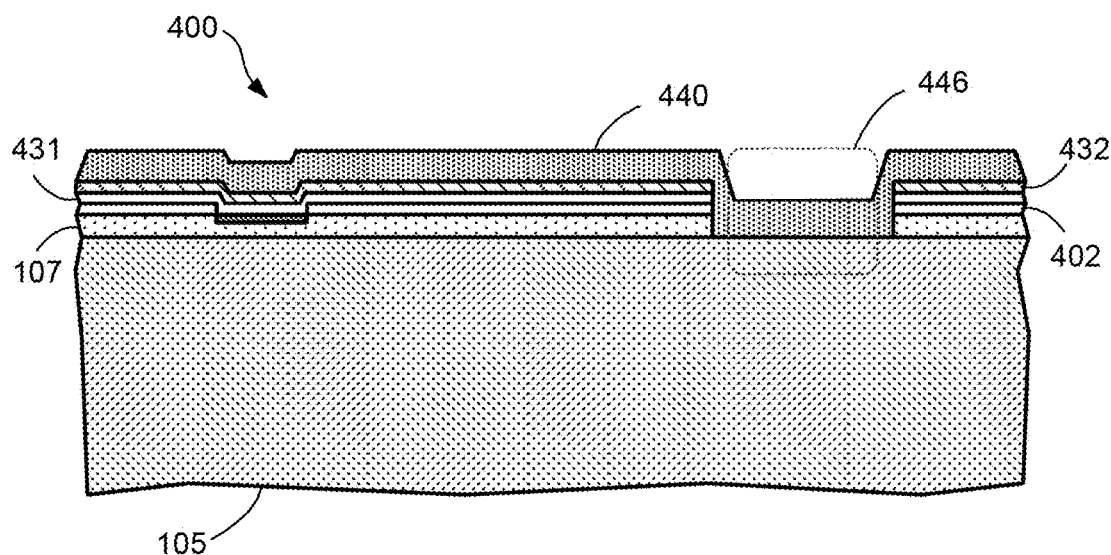

Another embodiment is depicted in FIG. 4-4B, in which the one or more layers comprising a second semiconductor material 440 are formed directly on an underlying highly doped substrate 105 in a second device region 446. This embodiment corresponds to structure depicted in FIG. 1. In such an embodiment, the intrinsic layer 107 can be etched away in the second device region 446 before epitaxial growth of the one or more layers comprising a second semiconductor material 440. For example and referring to FIG. 4-3, a timed reactive ion etching process can be used to remove the intrinsic layer 107 in the second opening 434. The nitride layer 432 can serve as an etch mask for removing the intrinsic layer 107, for example. As described in connection with FIG. 3, it can be beneficial to form a second semiconductor device on a highly conductive semiconductor to reduce losses associated with parasitic conductance in an underlying more resistive and lossy semiconductor material.

Figures 4, 4C:
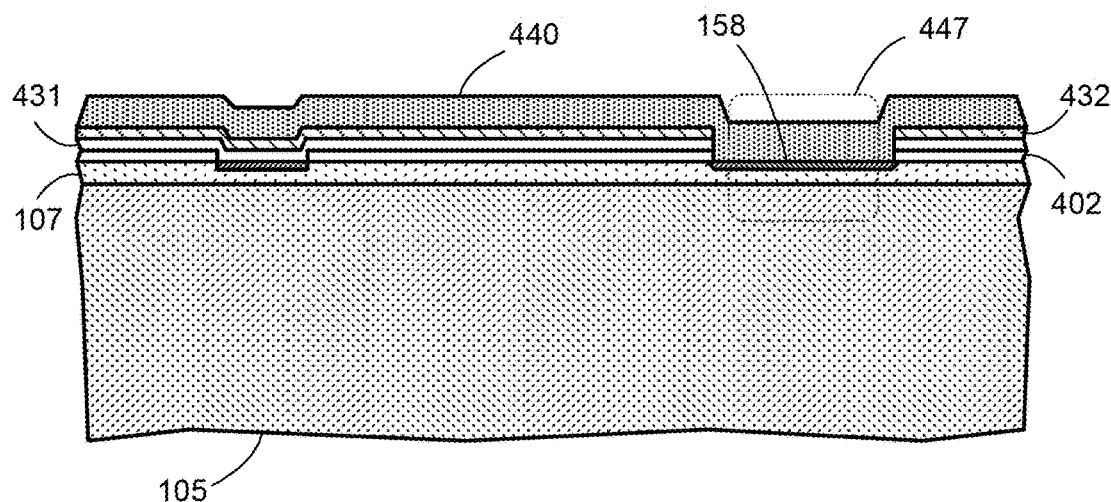

A third embodiment is depicted in FIG. 4-4C, in which the one or more layers comprising a second semiconductor material 440 are formed on a highly doped region 158 of the intrinsic layer 107 in a second device region 447. This embodiment corresponds to structure depicted in FIG. 2. Referring to FIG. 4-3, ion implantation and diffusion can be performed in the second opening 434, where the nitride layer 432 and oxide layers 431, 402 can serve as implantation masks. This process may avoid a lengthy etching step to remove the intrinsic layer 107, and yet provide a highly conductive region directly below the second semiconductor device.

Figures 4, 5:
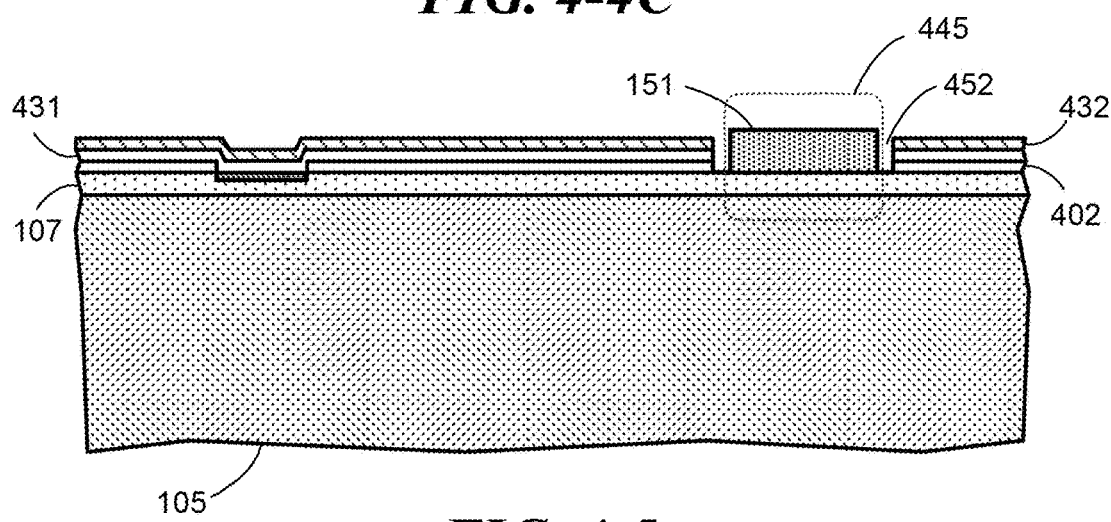

Continuing with the example illustrated in FIG. 4-4A, though the following process steps can be employed for the embodiments depicted in FIG. 4-4B and FIG. 4-4C, a resist and etching process can be used to remove the one or more layers comprising a second semiconductor material 440 in areas outside the second device region 445, as illustrated in FIG. 4-5. For example, the etching process can comprise a reactive ion etching process that removes a majority of the material 440. The etching can also remove some of the material 440 within the second opening 434, leaving gaps 452 near an edge of the second opening where a defect density of the epitaxially grown second semiconductor can be higher than near the center of the second opening 434. The etching process can leave an island of one or more epitaxial layers 151 of the second semiconductor material within the second opening 434 comprising a second device region 445, as depicted in FIG. 4-5.

After forming one or more epitaxial layers 151 of a second semiconductor material and a second device region 445, the layers 151 can be covered with one or more protective layers in preparation for forming intervening regions of electrically-insulating material. According to some embodiments, a second protective layer 461 and third protective layer 462 can be formed over at least the one or more epitaxial layers 151 of the second semiconductor material in the second device region 445, as depicted in FIG. 4-6A. The second protective layer 461 can comprise a nitride or aluminum oxide or multilayer combination thereof, which can be deposited by any one of a variety of low-temperature processes. A low-temperature process can comprise a process in which the substrate temperature does not exceed 400° C. Example low-temperature processes include electron-beam evaporation, sputtering, plasma-enhanced chemical vapor deposition (PECVD), and atomic layer deposition (ALD). In embodiments, the second protective layer 461 is needed to protect the one or more epitaxial layers 151 of second semiconductor material (e.g., layers comprising gallium nitride) during deposition of the third protective layer 462. A thickness of the second protective layer 461 can be between 50 nm and 300 nm.

The third protective layer 462 can comprise a high quality silicon nitride that is deposited by LPCVD, according to some embodiments. The silicon nitride for the third protective layer 462 can be deposited at temperatures as high as 800° C. and pressures between 150 millitorr and 250 millitorr. In embodiments, the hydrogen content of the second protective layer 461 and/or third protective layer 462 is controlled to be not more than 15%. In some cases, the hydrogen content of the second protective layer 461 and/or third protective layer 462 is controlled to be not more than 10%. The third protective layer can be beneficial in additionally protecting the one or more epitaxial layers 151 of second semiconductor material during formation of the insulating material 170, which can require temperatures as high as 900° C. A thickness of the third protective layer 462 can be between 50 nm and 300 nm.

A subsequent resist and etching process can be used to remove protective layers and oxide layers in areas around the first device region and second device region, as depicted in FIG. 4-6B. For example, a resist can be patterned to cover the first device region and second device region and protect them from subsequent etching steps. In some embodiments, reactive ion etching steps can be used to etch through the protective layers and oxide layers to expose the underlying intrinsic layer 107 and/or semiconductor substrate 105. The resist can then be stripped from the wafer 400 leaving the structure depicted in FIG. 4-6B.

An additional resist and etching process can be used to form cavities 464 into the underlying semiconductor substrate 105, as illustrated in FIG. 4-6C. In some cases, an inductively coupled plasma (ICP) etching process can be used to etch deep cavities 464 into the substrate 105. In some cases, the resist can be patterned to protect a region of the substrate from being etched to form a backside via 465. The backside via 465 can be used to provide a conductive path from a process side of the wafer 400 and resulting HMIC substrate to a backside of the HMIC substrate. The etch depth of the cavities 464 into the substrate 105 can be between 120 microns and 200 microns. The cavities 464 can provide receptacles into which electrically-insulating material is formed.

In embodiments and referring to FIG. 4-7A, a resist (not shown) can be applied and patterned to mask the first and second semiconductor device regions, and a conductive film 471 can be deposited over exposed regions of the wafer 400. The resist and part of the conductive film deposited on the resist can be removed using a lift-off process, leaving the structure shown in FIG. 4-7A. Alternatively, the conductive film 471 can be deposited over the entire area that includes the cavities 464 as well as the first and second semiconductor device regions. Subsequently, a resist can be patterned with openings over the first and second device regions, so that the conductive film 471 in these regions can be etched away leaving the structure shown in FIG. 4-7A. In some cases, the conductive film comprises cobalt silicide, though other conductive materials can be used alternatively or additionally.

In some implementations, a dielectric film 472 can be formed over the entire area, as depicted in FIG. 4-7B. For example, an oxide or nitride film can be deposited conformally over the structure by PECVD or ALD, for example. The dielectric film 472 can help protect the conductive film 471 during a subsequent step in which an insulating material 170 is applied to the wafer as well as provide an etch stop for subsequent etching of the insulating material 170.

In embodiments, the insulating material 170 can comprise a glass substrate that is slumped onto the wafer at high temperature and low pressure, so that the glass reflows filling cavities 464, as depicted in FIG. 4-7C. An example glass substrate that can be used is a Corning 7070 borosilicate glass, which can have a coefficient of thermal expansion that approximately matches the coefficient of thermal expansion for silicon. Other glasses can be used for other substrate materials. A thickness of the glass substrate can be between 250 microns and 750 microns.

A process of slumping the insulating material 170 onto the wafer 400 can comprise placing the material 170 and wafer 400 in contact and under vacuum between 10 millitorr and 50 millitorr, heating the insulating material 170 and wafer to a temperature between 700° C. and 900° C., allowing the insulating material 170 to reflow into cavities 464 for a period of time, placing the material 170 and wafer 400 under pressure between 1 atmosphere and 3 atmosphere, and cooling the material 170 and wafer 400 to a temperature below the glass transition temperature of the material 170. A dry gas (e.g., nitrogen or argon) can be used to place the material 170 and wafer 400 under pressure, so that the material 170 does not absorb moisture. Although the insulating material 170 can fill most of the cavities' volumes, air pockets 475 can become trapped at the bottom of the cavities, as depicted in FIG. 4-7C.

A planarization step (e.g., grind and polish, or chemical mechanical polish) can be performed to form a planar surface 478 on the insulating material 170, as depicted in FIG. 4-7D. The planar surface 478 can allow subsequent quality lithographic and microfabrication processes to be carried out on the wafer 400 to form RF circuitry.

Forming RF circuitry for an HMIC can comprise etching the insulating material 170 and underlying protective and oxide layers to expose underlying conductors and semiconductors. For example, a resist and etching process can be used to form openings 481, 482, 483, 484 in the insulating material 170, as depicted in FIG. 4-8A. In some cases, the dielectric film 472 can provide a beneficial etch stop that permits significantly different etch depths of the openings 481, 482, 483, 484 without affecting material underlying the dielectric film 472. For example, etch depths of the openings 481, 482, 483, 484 can vary by a factor of 2 or more. Plasma etching and/or wet chemical etching can be used to form openings 481, 482, 483, 484. In some cases, a weak anisotropic etch can be used so that sidewalls in the openings of the insulating material 170 are sloped outward to permit patterning of conductive interconnects along the sidewalls.

In some cases, the patterned insulating material 170 can serve as an etch mask for the underlying protective layers and oxide layers. Additionally or alternatively, a resist used to pattern the insulating material 170 can provide an etch mask for the underlying protective layers and oxide layers. One or more etching steps can be carried out to extend the openings 481, 482, 483, 484 through the protective and oxide layers to the underlying semiconductors 108, 151 and conductive film 471, as depicted in FIG. 4-8B.

Conventional lithographic and microfabrication processes can subsequently be performed to form RF circuit elements on the wafer 400. FIG. 5 illustrates several examples of circuit elements that can be formed on the wafer 400. Example elements include, but are not limited to, conductive interconnects 111, 113, 124, 126, 134, 162, 164, a spiral inductor 120, a metal-insulator-metal (MIM) capacitor 130, thin-film resistor 140, and transistor contacts 152, 154, 156. In the illustrated example, a first interconnect 111 connects a thin-film resistor 140 to an anode of a p-i-n diode 110. A second interconnect 113 connects an inductor 120 to a cathode of the p-i-n diode 110. A third interconnect 124 connects a center of the inductor 120 to the conductive film 471 and backside via 465. A fourth interconnect 126 connects the inductor 120 to a MIM capacitor 130. A fifth interconnect 134 connects the MIM capacitor to a drain contact 152 of a HEMT 150. A sixth interconnect 162 connects to a gate contact 154 of the HEMT, and a seventh interconnect 164 connects a source contact 156 of the HEMT 150 to the conductive film 471 and underlying substrate 105. The RF circuitry illustrated in FIG. 5 is only an example of some circuit elements and their arrangement and does not limit the invention to only the illustrated embodiments. A wide variety of different circuit elements and arrangements can be formed on an HMIC as will be appreciated by those skilled in the art of microfabrication of RF circuitry.

Figures 4, 5, 6, 6A:
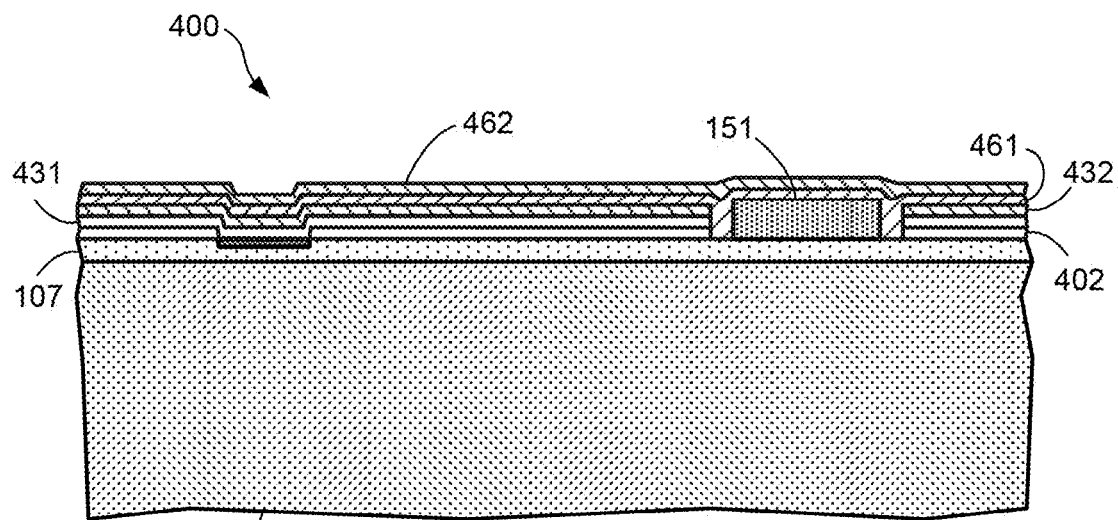
Figures 4, 5, 6, 6B:
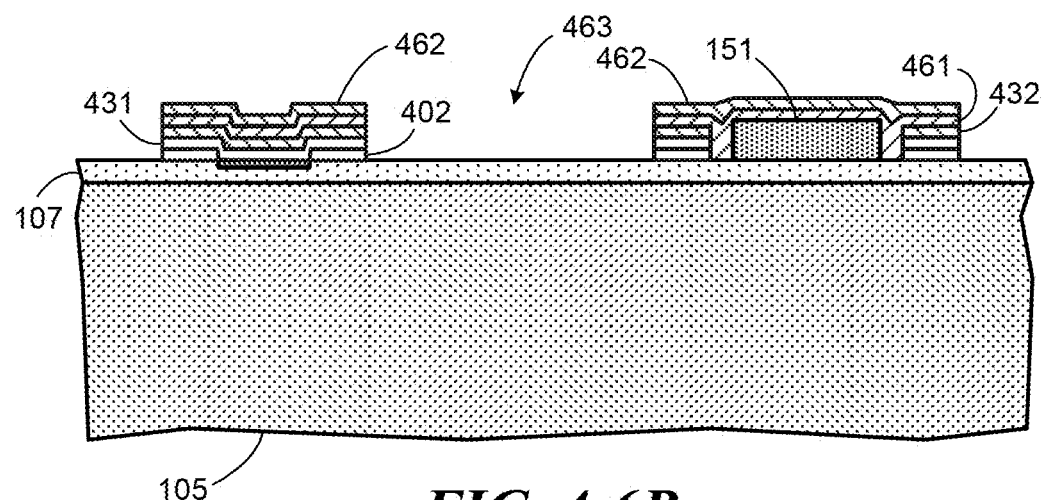
Figures 4, 5, 6, 6C:
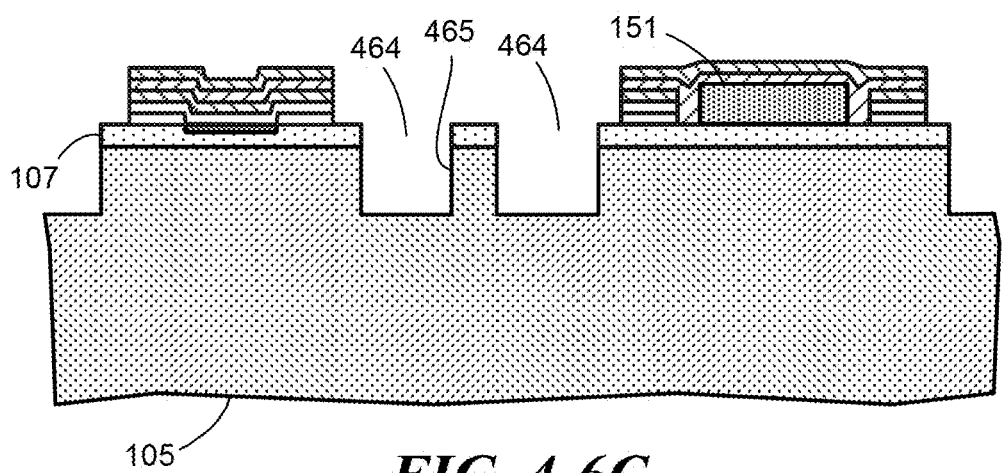

After forming RF circuitry on a wafer 400, the circuitry can be encapsulated with a passivation layer 180, as illustrated in FIG. 6. In some embodiments, a passivation layer 180 comprises a polymer, such as but not limited to polyimide or benzocyclobutene. In some cases, an inorganic passivation layer can be used, such as but not limited to an oxide or nitride.

Figures 4, 5, 6, 7, 7A:
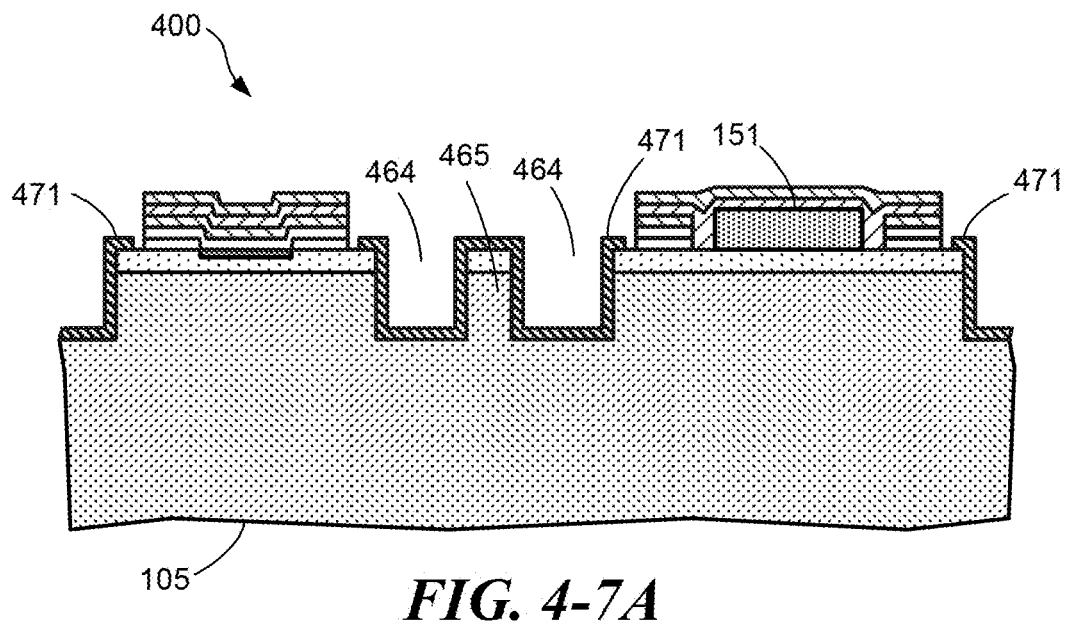
Figures 4, 5, 6, 7, 7B:
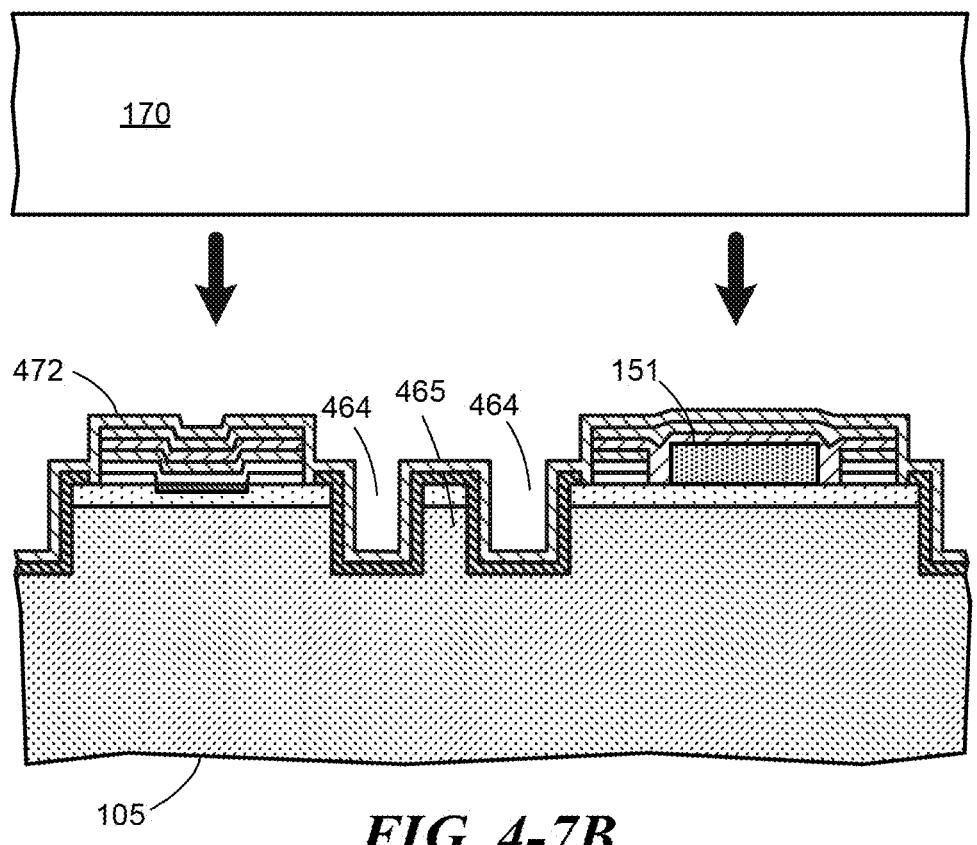
Figures 4, 5, 6, 7, 7C:
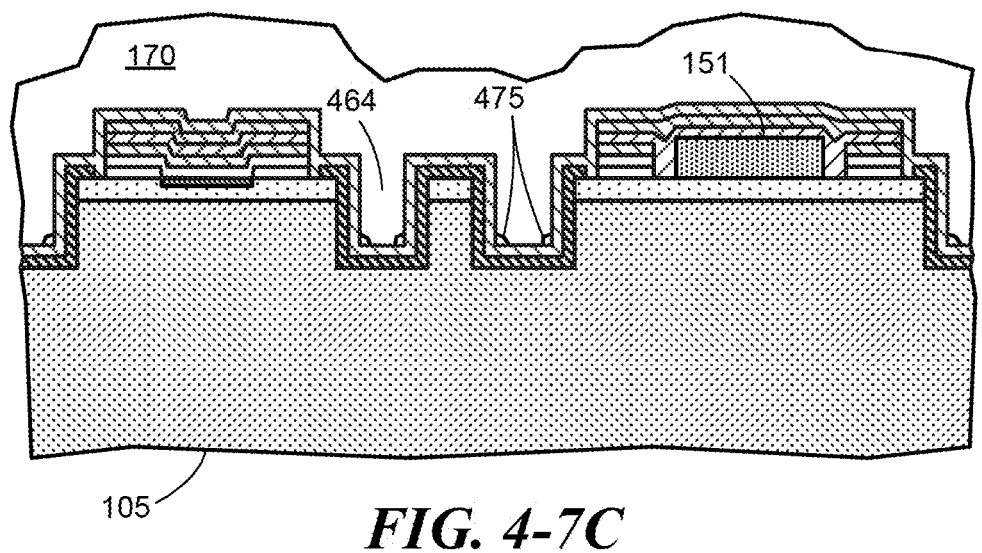
Figures 4, 5, 6, 7, 7D:
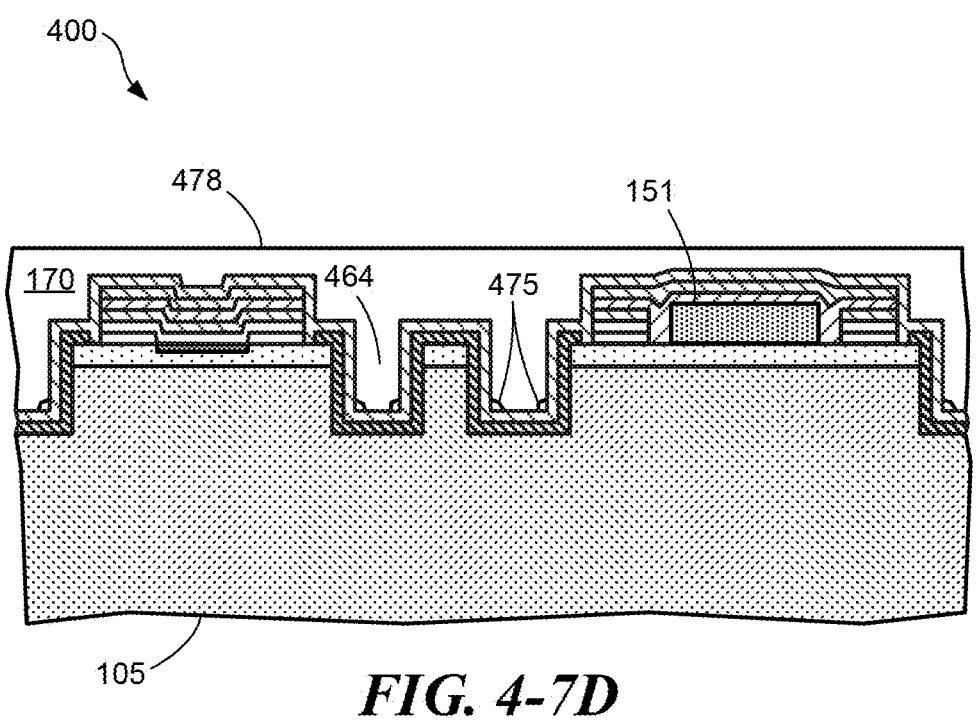

In embodiments, a backside of the wafer 400 can be ground down and polished to remove a significant portion of the wafer's bulk substrate 105 when forming a final HMIC substrate. A thickness $t_2$ of the HMIC substrate can be between 50 microns and 200 microns. In some cases, the amount of substrate 105 removed extends beyond the lowest layer 610 of conductive film 471 in the cavities, so that different regions having remaining substrate 105 can be electrically isolated from each other, as can be seen in FIG. 7. In some cases, the amount of substrate 105 removed extends additionally beyond the air pockets 475. FIG. 7 illustrates an example HMIC substrate in which the backside of the wafer 400 has been removed to an extent that the air pockets 475 have been removed. In some implementations, islands of an insulating film 192 can be patterned on the backside of the wafer 400 to electrically isolate semiconductor devices (e.g., semiconductor device 110 in the illustrated example) from a backside conductive film 190. In embodiments, the backside conductive film 190 can provide a ground plane as described above in connection with FIG. 1. An example conductive film 190 can comprise a titanium adhesion layer and gold film deposited by any suitable means (e.g., electron-beam evaporation). Compositions other than Ti/Au can be used for the conductive film in other embodiments, for example compositions that include additionally or alternatively one or more of the following materials: nickel, tin, tungsten, chrome, aluminum, copper, silver. After RF circuitry has been patterned on an HMIC and the wafer's backside has been processed, the remaining wafer 400 can be diced to form a plurality of HMIC dies.

Figures 4, 5, 6, 7, 8, 8A:
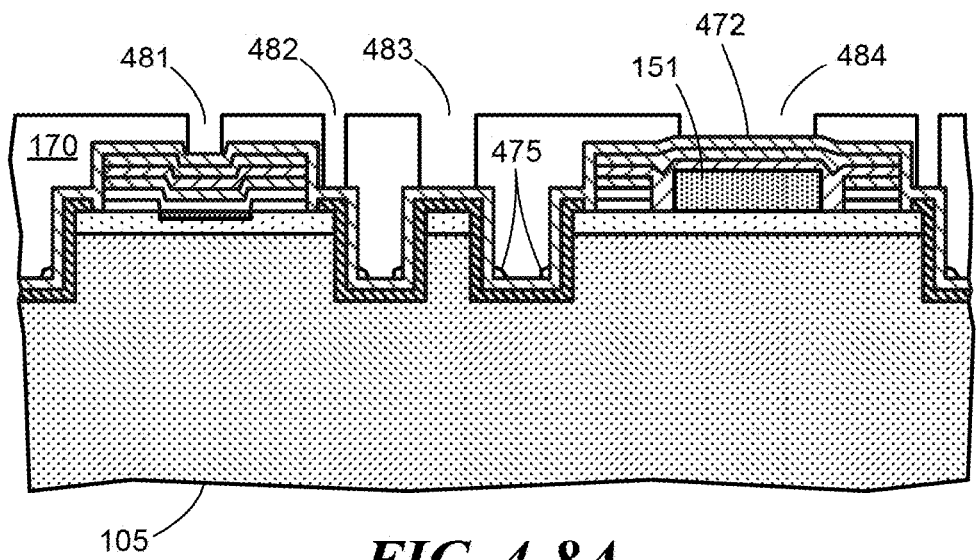
Figures 4, 5, 6, 7, 8, 8B:
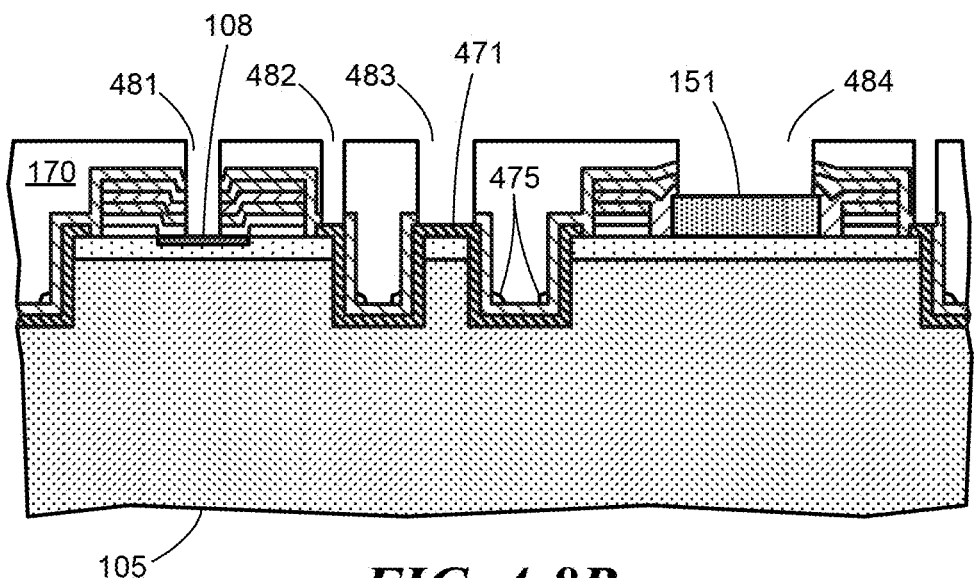
Figure 5:
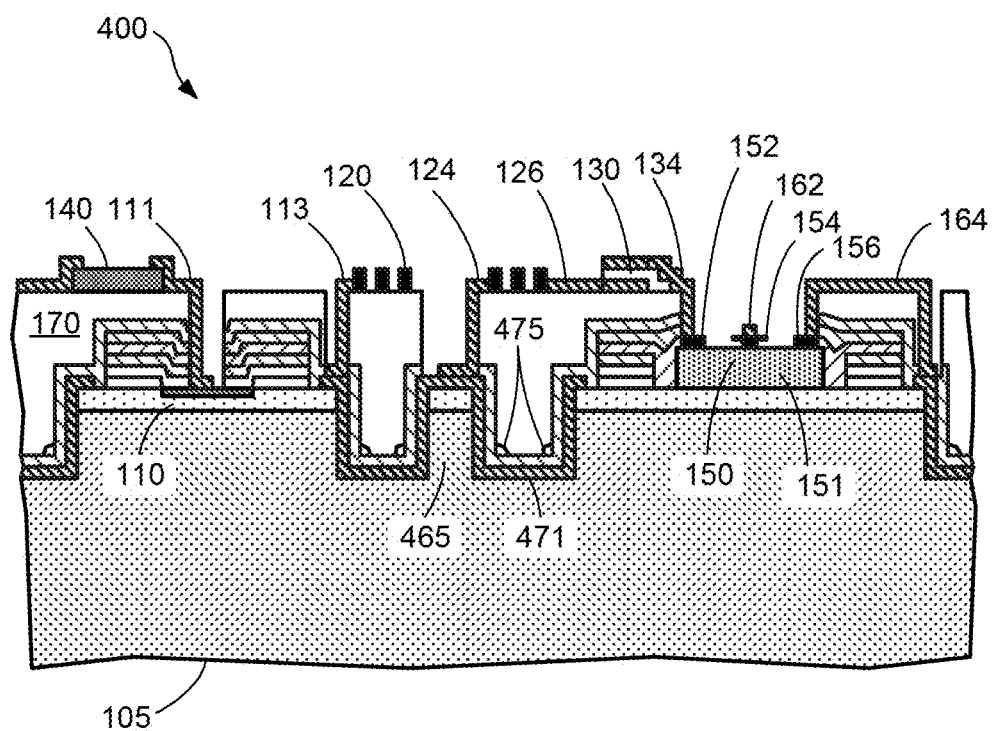
Figure 6:
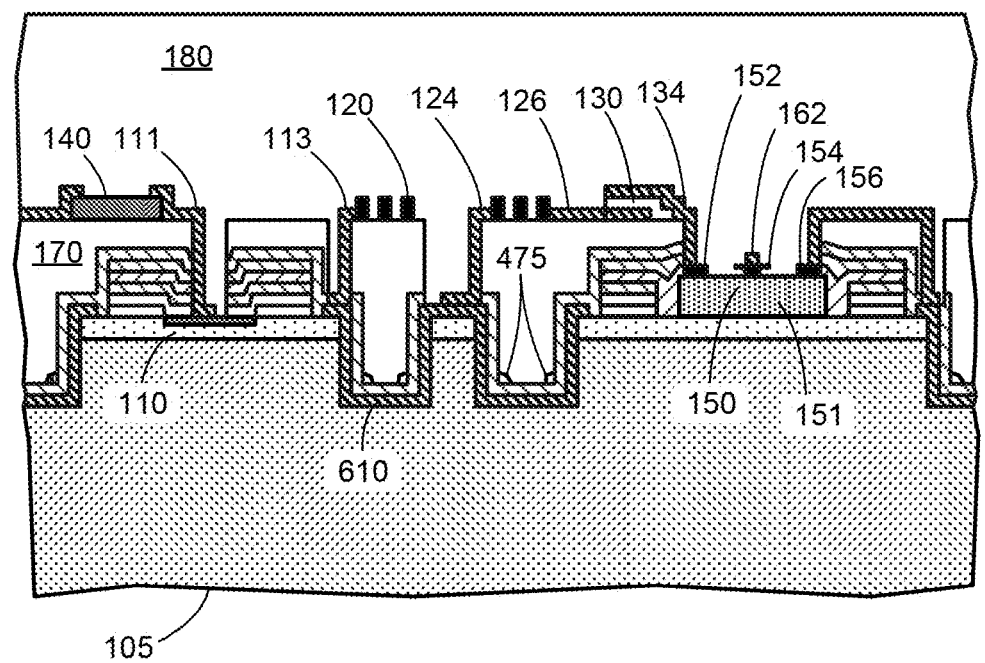
Figure 7:
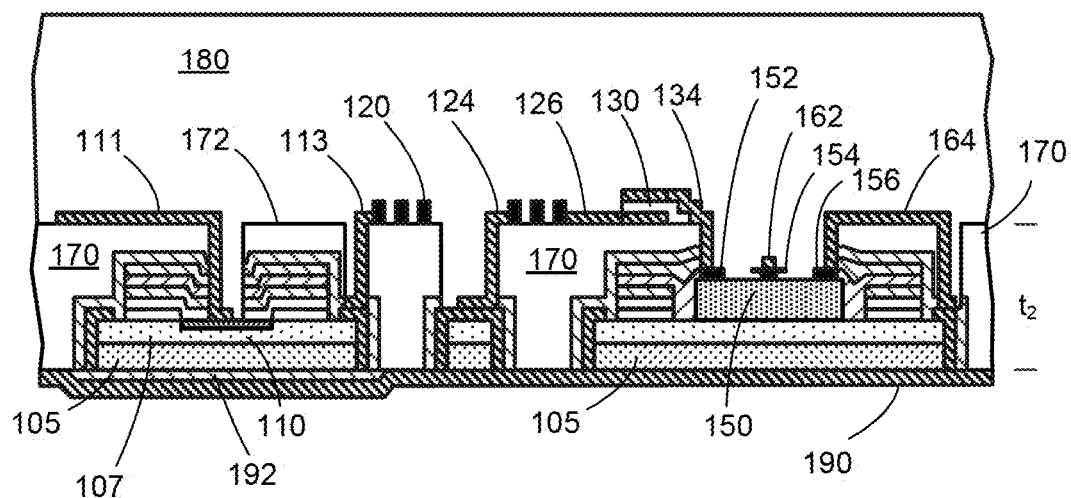
Figure 8A:
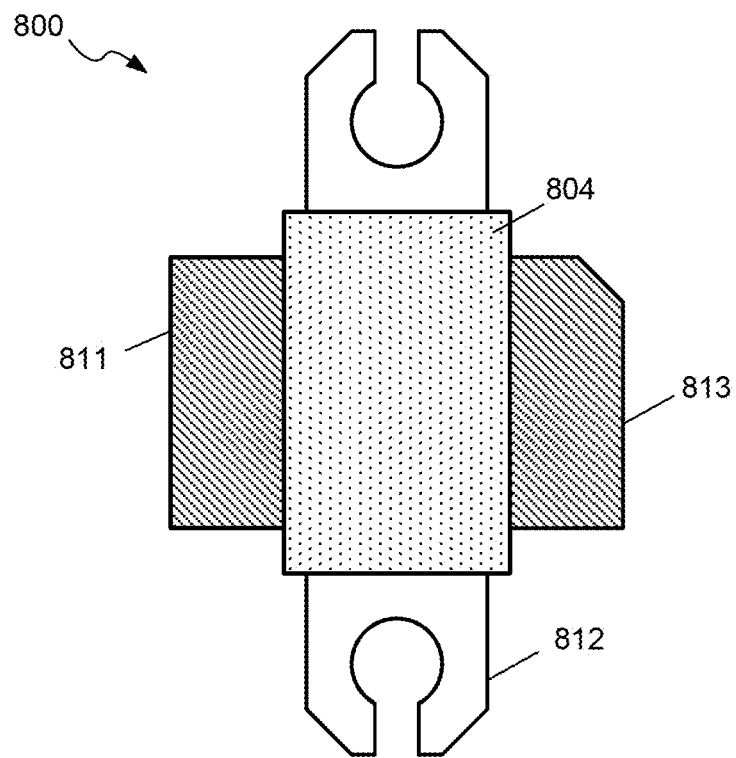
Figure 8B:
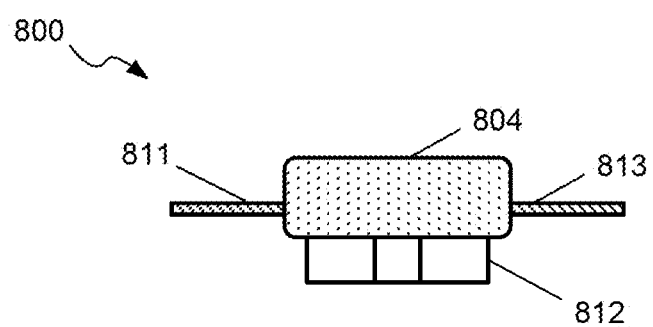

One or more HMIC dies can be packaged in any suitable package. FIG. 8A and FIG. 8B depict one example of a package 800 that can be used to enclose an HMIC die containing one or more transistors, such as one or more high power HEMTs. The package shown in FIG. 8A and FIG. 8B can be suitable for an amplifier device. Other package shapes and form factors can be used for amplifiers and other devices. As an example, the HEMTs can be arranged with RF circuitry on the HMIC as an amplifier circuit for amplifying RF signals. In some embodiments, the HEMTs can be arranged on the HMIC as a Doherty amplifier. With suitable heat dissipation through the package's conductive mount 812, a packaged HMIC amplifier can amplify input signals up to 100 Watts and even up to 300 Watts of output power. In some cases, a packaged HMIC amplifier can amplify input signals up to 500 Watts of output power.

An example package for an HMIC can comprise an enclosure 804 that surrounds the HMIC. The enclosure 804 can be metal-ceramic or metal-plastic, according to some embodiments. In some cases, the enclosure 804 can comprise plastic or comprise a plastic overmold enclosure. In some implementations, a package 800 can include a ceramic air-cavity or a plastic air-cavity, within which the HMIC is located. A plastic over-mold package may have no air cavity around the HMIC. A package 800 for an HMIC that includes one or more transistors can include a gate terminal 811, a drain terminal 813, and an electrically and thermally conductive mount 812. In some cases, the gate terminal 811 and drain terminal 813 can be shaped as fins. The conductive mount 812 can be formed from one or more metals, such as aluminum, an aluminum alloy, copper, a copper alloy, though other metal compositions may be used. In addition to heat dissipation, the conductive mount 812 can provide electrical connection to a reference potential, e.g., ground. An end-on elevation view of the example package 800 is depicted in FIG. 8B.

An integrated circuit can be embodied in different configurations. Example configurations include combinations of configurations (1) through (16) as described below.

(1) An integrated circuit comprising a first region of a substrate containing a first integrated device formed from a first semiconductor material; a second region of the substrate containing a second integrated device formed from a second semiconductor material of a different base elemental composition than the first semiconductor material; and a third region of the substrate containing an electrically-insulating dielectric material that extends through the substrate, wherein the third region of the substrate is located between the first region and the second region.

(2) The integrated circuit of configuration (1), wherein the second semiconductor material is formed on the first semiconductor material located in the second region.

(3) The integrated circuit of configuration (1), further comprising an intrinsic region of the first semiconductor material located between the second semiconductor material and the first semiconductor material in the second region.

(4) The integrated circuit of configuration (1), further comprising an intrinsic region of the first semiconductor material located between the second semiconductor material and the first semiconductor material in the second region; and a highly doped portion of semiconductor material located between the second semiconductor material and the intrinsic region of the first semiconductor material.

(5) The integrated circuit of any one of configurations (1) through (4), wherein the first semiconductor material has a base elemental composition of silicon.

(6) The integrated circuit of configuration (5), wherein the first integrated device comprises a semiconductor diode.

(7) The integrated circuit of configuration (5) or (6), wherein the first integrated device comprises a p-i-n or n-i-p semiconductor diode.

(8) The integrated circuit of any one of configurations (1) through (7), wherein the second semiconductor material includes a base elemental composition of gallium-nitride material.

(9) The integrated circuit of any one of configurations (1) through (7), wherein the second semiconductor material includes a base elemental composition of gallium-nitride (GaN).

(10) The integrated circuit of any one of configurations (1) through (9), wherein the second integrated device comprises a transistor.

(11) The integrated circuit of any one of configurations (1) through (9), wherein the second integrated device comprises a high-electron-mobility transistor.

(12) The integrated circuit of any one of configurations (1) through (11), further comprising at least one conductive interconnect formed over the third region.

(13) The integrated circuit of any one of configurations (1) through (12), further comprising at least a portion of one passive circuit element formed over the third region.

(14) The integrated circuit of configuration (13), wherein the passive circuit element is an inductor.

(15) The integrated circuit of any one of configurations (1) through (14), further comprising a ground plane formed on a back side of the substrate below the first region, second region, and third region; and a passivation layer formed over the first region, second region, and third region.

(16) The integrated circuit of any one of configurations (1) through (15), wherein a thickness of the substrate is between 50 microns and 200 microns.

Methods for making an integrated circuit can include various processes. Example methods include combinations of processes (17) through (27) as described below. These processes may be used, at least in part, to make an integrated circuit of the configurations listed above.

(17) A method of making a heterolithic microwave integrated circuit comprising forming a first semiconductor device from a first semiconductor material in a first region of a wafer; forming a second semiconductor material on the first semiconductor material in a second region of the wafer, the second semiconductor material having a different base elemental composition than the first semiconductor material; forming a second semiconductor device from the second semiconductor material; etching a cavity in a third region of the wafer; filling the cavity with an electrically-insulating material; planarizing the electrically-insulating material; and removing a portion of a backside of the wafer to form a substrate, wherein the electrically-insulating material extends through the substrate.

(18) The method of (17), wherein forming the first semiconductor device comprises forming a semiconductor diode and wherein the first semiconductor material has a base elemental composition of silicon.

(19) The method of (17) or (18), wherein forming the second semiconductor device comprises forming a transistor and wherein the second semiconductor material has a base elemental composition of gallium-nitride material.

(20) The method of any one of processes (17) through (19), wherein forming the second semiconductor material comprises epitaxially growing the second semiconductor material on an intrinsic region of the first semiconductor material.

(21) The method of any one of processes (17) through (19), wherein forming the second semiconductor material comprises highly doping an intrinsic layer on the first semiconductor material to form a highly doped portion of the intrinsic layer; and epitaxially growing the second semiconductor material on the highly doped portion of the intrinsic layer.

(22) The method of any one of processes (17) through (19), wherein forming the second semiconductor material comprises epitaxially growing the second semiconductor material on highly doped first semiconductor material in the second region of the wafer.

(23) The method of any one of processes (17) through (22), further comprising covering the second semiconductor material with a protective layer before filling the cavity.

(24) The method of any one of processes (17) through (23), wherein filling the cavity comprises forcing into the cavity under pressure the electrically-insulating material that is heated above its glass transition temperature.

(25) The method of any one of processes (17) through (24), wherein removing a portion of the backside of the wafer comprises removing regions at a bottom of the cavity that are not filled with the electrically-insulating material and planarizing a backside of the substrate.

(26) The method of any one of processes (17) through (25), further comprising forming a conductive interconnect over the electrically-insulating material in the third region.

(27) The method of any one of processes (17) through (26), further comprising forming at least a portion of a passive device over the electrically-insulating material in the third region.

CONCLUSION

Unless stated otherwise, the terms "approximately" and "about" are used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" can include the target dimension. The term "essentially" is used to mean within ±3% of a target dimension.

The technology described herein may be embodied as a method, of which at least some acts have been described. The acts performed as part of the method may be ordered in any suitable way. Accordingly, embodiments may be implemented in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An integrated circuit, comprising:
a first region of the integrated circuit, the first region containing a p-i-n or n-i-p semiconductor diode formed on a substrate from a first semiconductor material of a first base elemental composition that is common with the substrate;
a second region of the integrated circuit, the second region containing a transistor formed on the substrate from gallium-nitride material, the composition of the gallium-nitride material being different than the first semiconductor material of the first base elemental composition and the substrate; and
a third region of the integrated circuit containing an electrically-insulating dielectric material that extends through the substrate and separates the substrate between the first region and the second region.

2. The integrated circuit of claim 1, further comprising an intrinsic region of the first semiconductor material located between the gallium-nitride material and the substrate in the second region.

3. The integrated circuit of claim 1, wherein the first semiconductor material has a base elemental composition of silicon.

4. The integrated circuit of claim 1, wherein the gallium-nitride material comprises gallium-nitride (GaN).

5. The integrated circuit of claim 1, wherein the transistor comprises a high-electron-mobility transistor.

6. The integrated circuit of claim 1, further comprising at least one conductive interconnect formed over the third region.

7. The integrated circuit of claim 1, further comprising at least a portion of one passive circuit element formed over the third region.

8. The integrated circuit of claim 7, wherein the passive circuit element is an inductor.

9. The integrated circuit of claim 1, further comprising:
a ground plane formed on a back side of the substrate below the first region, second region, and third region; and
a passivation layer formed over the first region, second region, and third region.

10. The integrated circuit of claim 1, wherein a thickness of the substrate is between 50 microns and 200 microns.

11. The integrated circuit of claim 1, wherein the electrically-insulating dielectric material extends entirely through the substrate.

12. The integrated circuit of claim 1, wherein the substrate comprises a semiconductor.

13. A method of making a heterolithic microwave integrated circuit, the method comprising:
forming a first semiconductor device from a first semiconductor material in a first region of a wafer;
forming a second semiconductor material on the first semiconductor material in a second region of the wafer, the second semiconductor material having a different base elemental composition than the first semiconductor material;
forming a second semiconductor device from the second semiconductor material;
etching a cavity in a third region of the wafer;
filling the cavity with an electrically-insulating material;
planarizing the electrically-insulating material; and
removing a portion of a backside of the wafer to expose the electrically-insulating material.

14. The method of claim 13, wherein forming the first semiconductor device comprises forming a semiconductor diode and wherein the first semiconductor material has a base elemental composition of silicon.

15. The method of claim 14, wherein forming the second semiconductor device comprises forming a transistor and wherein the second semiconductor material has a base elemental composition of gallium-nitride material.

16. The method of claim 13, wherein forming the second semiconductor material comprises epitaxially growing the second semiconductor material on an intrinsic region of the first semiconductor material.

17. The method of claim 13, further comprising covering the second semiconductor material with a protective layer before filling the cavity.

18. The method of claim 13, wherein filling the cavity comprises forcing into the cavity under pressure the electrically-insulating material that is heated above its glass transition temperature.

19. The method of claim 13, wherein removing a portion of the backside of the wafer comprises removing regions at a bottom of the cavity that are not filled with the electrically-insulating material and planarizing a backside of the wafer.

20. The method of claim 13, further comprising forming a conductive interconnect over the electrically-insulating material in the third region.

21. The method of claim 13, further comprising forming at least a portion of a passive device over the electrically-insulating material in the third region.

22. A packaged integrated circuit, comprising:
an enclosure; and
an integrated circuit within the enclosure, the integrated circuit comprising:
a first region of the integrated circuit, the first region containing a p-i-n or n-i-p semiconductor diode formed on a substrate from a first semiconductor material of a first base elemental composition that is common with the substrate;
a second region of the integrated circuit, the second region containing a transistor formed on the substrate from gallium-nitride material, the composition of the gallium-nitride material being different than the first semiconductor material of the first base elemental composition and the substrate; and
a third region of the integrated circuit containing an electrically-insulating dielectric material that extends through the substrate and separates the substrate between the first region and the second region.

* * * * *